US011316091B2

(12) United States Patent
Kim et al.

(10) Patent No.: US 11,316,091 B2
(45) Date of Patent: Apr. 26, 2022

(54) THERMOELECTRIC MODULE, FRAME FOR THE SAME, AND VEHICLE INCLUDING THE THERMOELECTRIC MODULE

(71) Applicants: HYUNDAI MOTOR COMPANY, Seoul (KR); KIA MOTORS CORPORATION, Seoul (KR)

(72) Inventors: Byung-Wook Kim, Seongnam-si (KR); Hoo Dam Lee, Seongnam-si (KR); Jin Woo Kwak, Suwon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 132 days.

(21) Appl. No.: 16/186,114

(22) Filed: Nov. 9, 2018

(65) Prior Publication Data

US 2020/0105993 A1    Apr. 2, 2020

(30) Foreign Application Priority Data

Oct. 1, 2018    (KR) .................... 10-2018-0117092

(51) Int. Cl.
*H01L 35/32* (2006.01)
*F01N 5/02* (2006.01)
(Continued)

(52) U.S. Cl.
CPC .............. *H01L 35/32* (2013.01); *F01N 5/025* (2013.01); *H01L 35/08* (2013.01); *H01L 35/30* (2013.01)

(58) Field of Classification Search
CPC ......... F01N 5/025; H01L 35/08; H01L 35/30; H01L 35/32; H01L 35/34
See application file for complete search history.

(56) References Cited

U.S. PATENT DOCUMENTS

2003/0140957 A1* 7/2003 Akiba ..................... H01L 35/30
136/224
2009/0277489 A1* 11/2009 Dannoux ................ H01L 35/32
136/201

(Continued)

FOREIGN PATENT DOCUMENTS

FR        2938020 A1 *  5/2010   ............. H01L 35/30

OTHER PUBLICATIONS

Machine translation of FR-2938020-A1, Schmidt Ralf. (Year: 2010).*

*Primary Examiner* — Mayla Gonzalez Ramos
(74) *Attorney, Agent, or Firm* — Morgan, Lewis & Bockius LLP (57) ABSTRACT

A thermoelectric module, a frame for the thermoelectric module, and a vehicle including the thermoelectric module is provided. The thermoelectric module includes a frame alternately bent toward a hot side on which a heat source is located and a cool side on which a cooling medium is located, to have a plurality of hot-side end portions in contact with the heat source, a plurality of cool-side end portions in contact with the cooling medium, and a plurality of thermoelectric element installation portions connecting the plurality of hot-side end portions and the plurality of cool-side end portions, a plurality of n-type and p-type thermoelectric elements arranged on the thermoelectric element installation portions, and a plurality of first electrodes and second electrodes that electrically connect, in series, the plurality of n-type and p-type thermoelectric elements arranged on each of the thermoelectric element installation portions.

14 Claims, 6 Drawing Sheets

(51) Int. Cl.
*H01L 35/30* (2006.01)
*H01L 35/08* (2006.01)

(56) References Cited

U.S. PATENT DOCUMENTS

| | | | |
|---|---|---|---|
| 2010/0257871 A1* | 10/2010 | Venkatasubramanian | ................... H01L 35/325 62/3.7 |
| 2016/0251992 A1* | 9/2016 | Kim | ........................ H01L 35/34 136/205 |
| 2019/0035997 A1* | 1/2019 | Savoy | ..................... H01L 35/10 |

\* cited by examiner

THERMOELECTRIC MODULE, FRAME FOR THE SAME, AND VEHICLE INCLUDING THE THERMOELECTRIC MODULE

CROSS-REFERENCE TO RELATED APPLICATION

The present application claims priority to and the benefit of Korean Patent Application No. 10-2018-0117092, filed on Oct. 1, 2018, which is incorporated herein by reference in its entirety.

TECHNICAL FIELD

The present disclosure relates to a thermoelectric module, a frame for the same, and a vehicle including the thermoelectric module. More particularly, the present disclosure relates to a thermoelectric-module frame having a shape alternately bent toward a hot side and a cool side, a thermoelectric module including the frame, and a vehicle including the thermoelectric module.

BACKGROUND

The statements in this section merely provide background information related to the present disclosure and may not constitute prior art.

A thermoelectric module is employed in a thermoelectric generator system using the Seebeck effect of generating an electromotive force by using different temperatures on opposite sides.

When the thermoelectric module is used for power generation, the output of the thermoelectric power generation may be increased by maintaining a significant temperature difference between a hot side and a cool side. In this case, the heat transfer rate from a heat source to the thermoelectric module has a great effect on the output of the power generation.

For example, the thermoelectric module may be employed in the field of generating electric power using waste heat from an exhaust system of a vehicle.

A general thermoelectric module includes a plurality of thermoelectric elements arranged on a substrate having a plate shape, and a high-temperature part receiving thermal energy from a heat source has a surface with a predetermined area. In the case where the thermoelectric module is installed in an exhaust system of a vehicle, the thermoelectric module has to be mounted on a part having a flat surface of a predetermined area with which the high-temperature part of the thermoelectric module is able to be brought into contact, and therefore there is a limitation in the installation of the thermoelectric module. Alternatively, in the case where the thermoelectric module is mounted on a curved surface such as an exhaust tube, thermal energy is not effectively transferred from the heat source to the thermoelectric module, and a large amount of thermal energy is lost.

SUMMARY

An aspect of the present disclosure provides a thermoelectric module having a structure for effectively performing thermoelectric power generation using a polygonal or circular pipe heat source.

Another aspect of the present disclosure provides a thermoelectric module having a structure robust to external shocks.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a thermoelectric module includes a frame alternately bent toward a hot side on which a heat source is located and a cool side on which a cooling medium is located, to have a plurality of hot-side end portions in contact with the heat source, a plurality of cool-side end portions in contact with the cooling medium, and a plurality of thermoelectric element installation portions connecting the plurality of hot-side end portions and the plurality of cool-side end portions, a plurality of n-type and p-type thermoelectric elements arranged on the thermoelectric element installation portions, and a plurality of first electrodes and second electrodes that electrically connect, in series, the plurality of n-type and p-type thermoelectric elements arranged on each of the thermoelectric element installation portions.

According to another aspect of the present disclosure, a frame for a thermoelectric module has a plate shape with a predetermined thickness in an up/down direction and includes a plurality of guide grooves alternately formed in pairs on a top side and a bottom side of the frame to allow the frame to be alternately bent upward and downward. The plurality of guide grooves extend in a first direction perpendicular to the up/down direction and are arranged parallel to each other in a second direction that is perpendicular to the up/down direction and the first direction.

The plurality of guide grooves include a plurality of pairs of first guide grooves formed on the top side of the frame and a plurality of pairs of second guide grooves formed on the bottom side of the frame.

Each pair of first guide grooves are spaced apart from each other by a first distance, each pair of second guide grooves are spaced apart from each other by a second distance, and the pair of first guide grooves are spaced apart from the pair of second guide grooves by a third distance, such that the frame installed in the thermoelectric module has a plurality of hot-side end portions in contact with a heat source, a plurality of cool-side end portions in contact with a cooling medium, and a plurality of thermoelectric element installation portions that connect the plurality of hot-side end portions and the plurality of cool-side end portions and on which thermoelectric elements are arranged.

According to another aspect of the present disclosure, a vehicle includes an exhaust tube through which high-temperature fluid flows and a thermoelectric module mounted on the exhaust tube to generate power using heat of the fluid flowing through the exhaust tube.

The thermoelectric module includes a frame alternately bent toward a hot side on which the exhaust tube is located and a cool side on which a cooling medium is located, to have a plurality of hot-side end portions in contact with the exhaust tube, a plurality of cool-side end portions in contact with the cooling medium, and a plurality of thermoelectric element installation portions connecting the plurality of hot-side end portions and the plurality of cool-side end portions, a plurality of n-type and p-type thermoelectric elements arranged on the thermoelectric element installation portions, and a plurality of first electrodes and second electrodes that electrically connect, in series, the plurality of n-type and p-type thermoelectric elements arranged on each of the thermoelectric element installation portions.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Hereinafter, some forms of the present disclosure will be described in detail with reference to the accompanying drawings. It should be understood that even if shown in different drawings, identical elements are provided with identical reference numerals in the drawings. Furthermore, in describing some forms of the present disclosure, detailed descriptions related to well-known functions or configurations will be omitted when they may make subject matters of the present disclosure unnecessarily obscure.

Figure 1:
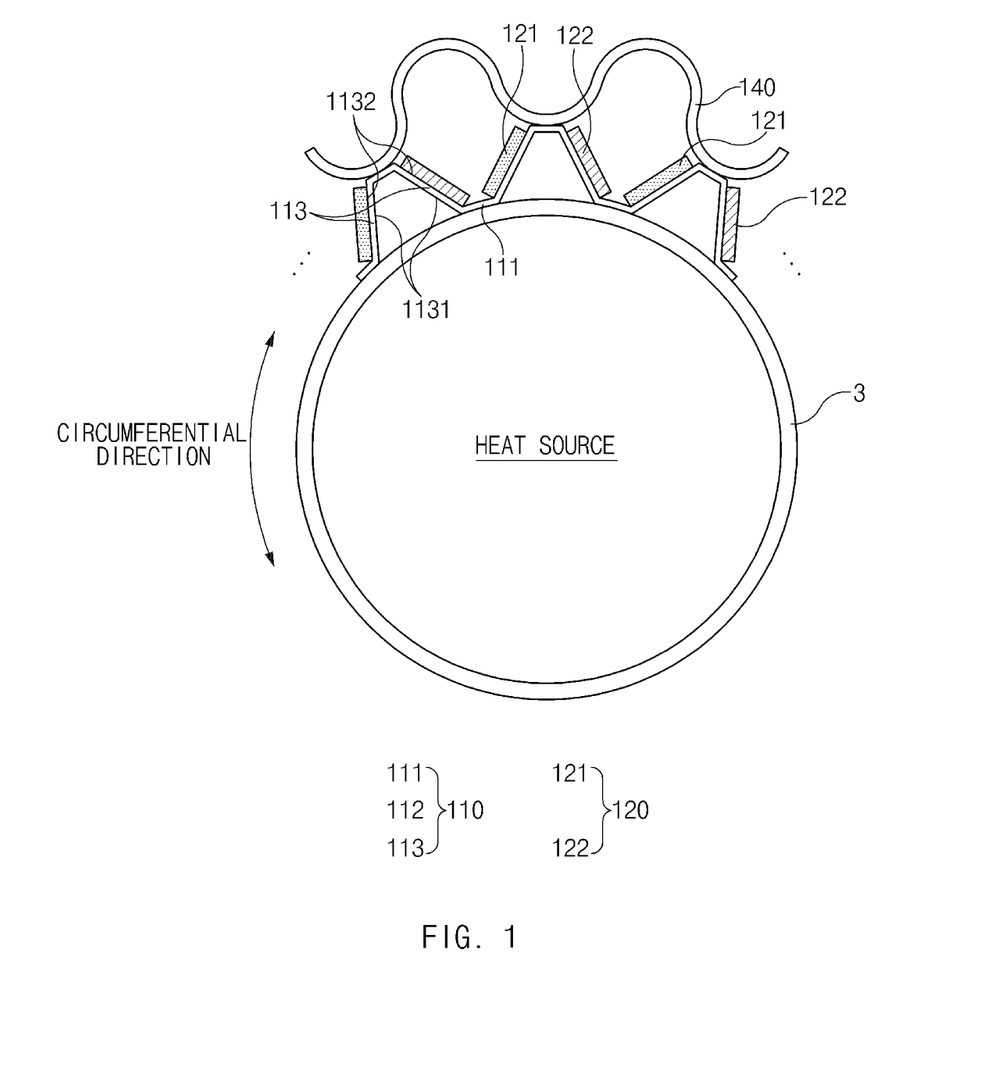
FIG. 1 is a schematic view illustrating a thermoelectric module in one form of the present disclosure.

FIG. 1 is a schematic view illustrating a thermoelectric module in some forms of the present disclosure.

The thermoelectric module in some forms of the present disclosure may include a frame 110, a plurality of thermoelectric elements 120, and a plurality of electrodes 130.

A general thermoelectric module includes a plurality of thermoelectric elements arranged on a substrate having a plate shape, and a high-temperature part receiving thermal energy from a heat source has a surface with a predetermined area. In the case where the thermoelectric module is installed in an exhaust system of a vehicle, the thermoelectric module has to be mounted on a part having a flat surface of a predetermined area with which the high-temperature part of the thermoelectric module is able to be brought into contact, and therefore there is a limitation in the installation of the thermoelectric module. Alternatively, in the case where the thermoelectric module is mounted on a curved surface such as an exhaust tube, thermal energy is not effectively transferred from the heat source to the thermoelectric module, and a large amount of thermal energy is lost.

The thermoelectric module in some forms of the present disclosure is applicable to various forms of heat sources. More specifically, the thermoelectric module in some forms of the present disclosure has a basic feature wherein, in order to provide contact portions that can make contact with various forms of heat sources, the thermoelectric module includes the frame 110 that is alternately bent toward a hot side on which a heat source is located and a cool side on which a cooling medium is located, to have a plurality of hot-side end portions in contact with the heat source, a plurality of cool-side end portions in contact with the cooling medium, and a plurality of thermoelectric element installation portions that connect the plurality of hot-side end portions and the plurality of cool-side end portions.

Characteristics of the thermoelectric module in some forms of the present disclosure will be described below in more detail.

In the following description, it will be exemplified that the thermoelectric module is mounted on an exhaust tube 3 of a vehicle. The exhaust tube 3 of the vehicle may have a circular cross-section, and the thermoelectric module may be mounted to surround at least part of the outer circumferential surface of the exhaust tube 3.

However, a heat source to which the thermoelectric module of the present disclosure is applicable is not limited thereto, and the thermoelectric module may be disposed in various positions other than the exhaust tube 3 of the vehicle. For example, the thermoelectric module of the present disclosure may be mounted to surround at least part of the outer surface of a pipe with a polygonal cross-section.

Referring to FIG. 1, the heat source may be the exhaust tube 3 having a pipe shape through which a high-temperature exhaust gas flows. The exhaust gas may be discharged outside the vehicle through the exhaust tube 3 and may transfer its thermal energy to the exhaust tube 3.

The frame 110 may include hot-side end portions 111, cool-side end portions 112, and thermoelectric element installation portions 113 that connect the hot-side end portions 111 and the cool-side end portions 112.

The frame 110 may be formed in a plate shape with a predetermined thickness in an up/down direction.

The frame 110 may be alternately bent toward a hot side on which the heat source is located and a cool side on which a cooling medium is located, to have the plurality of hot-side end portions 111 in contact with the heat source, the plurality of cool-side end portions 112 in contact with the cooling medium, and the plurality of thermoelectric element installation portions 113 that connect the plurality of hot-side end portions 111 and the plurality of cool-side end portions 112.

The frame 110 may include an inner surface facing the exhaust tube 3 and an outer surface facing the cooling medium. That is, one surface of the frame 110 in an unbent state may correspond to the inner surface, and an opposite surface of the frame 110 that is opposite to the inner surface may correspond to the outer surface.

The plurality of hot-side end portions 111 may have a hot-side contact surface in contact with the exhaust tube 3 and may be arranged in the circumferential direction of the exhaust tube 3.

The plurality of cool-side end portions 112 may have a cool-side contact surface in contact with the cooling medium and may be arranged in the circumferential direction. The cooling medium may be a cooling member 140.

The cooling medium may be the air-cooled cooling member 140 that is disposed to exchange heat with the plurality of cool-side end portions 112 and cooled by external air.

The air-cooled cooling member 140 may include inside ends that face the exhaust tube 3 and make contact with the plurality of cool-side end portions 112. The air-cooled cooling member 140 may include outside ends that are opposite to the inside ends and cooled by external air.

In some forms of the present disclosure, the air-cooled cooling member 140 may have a shape including a plurality of cooling fins.

In some forms of the present disclosure, the air-cooled cooling member 140 may be alternately bent toward the inner side in contact with the frame 110 and the outer side opposite to the inner side. For example, as illustrated in FIG. 1, the air-cooled cooling member 140 may be alternately bent toward the inner side and the outer side to have the inside ends in contact with the plurality of cool-side end portions 112 and the outside ends cooled by external air.

The air-cooled cooling member 140 may be mounted to surround the frame 110 in the circumferential direction outside the frame 110.

In some forms of the present disclosure, although not illustrated, the cooling medium may be a water-cooled cooling member that is disposed to exchange heat with the plurality of cool-side end portions 112 and through which cooling water flows. In this case, the water-cooled cooling member may have a cooling-water circulation passage therein, through which the cooling water flowing into the water-cooled cooling member circulates. For example, the cooling medium may be a cooling jacket through which cooling water flows.

In some forms of the present disclosure, although not illustrated, the thermoelectric module may be configured such that the cool-side end portions 112 are cooled by external air. In this case, a cooling means may be the external air or a member in communication with the external air.

A plurality of n-type thermoelectric elements 121 and a plurality of p-type thermoelectric elements 122 may be arranged on the thermoelectric element installation portions 113. The plurality of n-type thermoelectric elements 121 and the plurality of p-type thermoelectric elements may be alternately arranged on each of the thermoelectric element installation portions 113 in the longitudinal direction in which the exhaust tube 3 extends and that is perpendicular to the circumferential direction (see FIG. 1).

The plurality of thermoelectric element installation portions 113 may have an inner surface 1131 facing the heat source and an outer surface 1132 facing the cooling member 140.

The plurality of n-type and p-type thermoelectric elements 121 and 122 may be disposed on the outer surfaces 1132 of the plurality of thermoelectric element installation portions 113. That is, the plurality of n-type and p-type thermoelectric elements 121 and 122 may be arranged on the outer surface of the frame 110.

Figure 2:
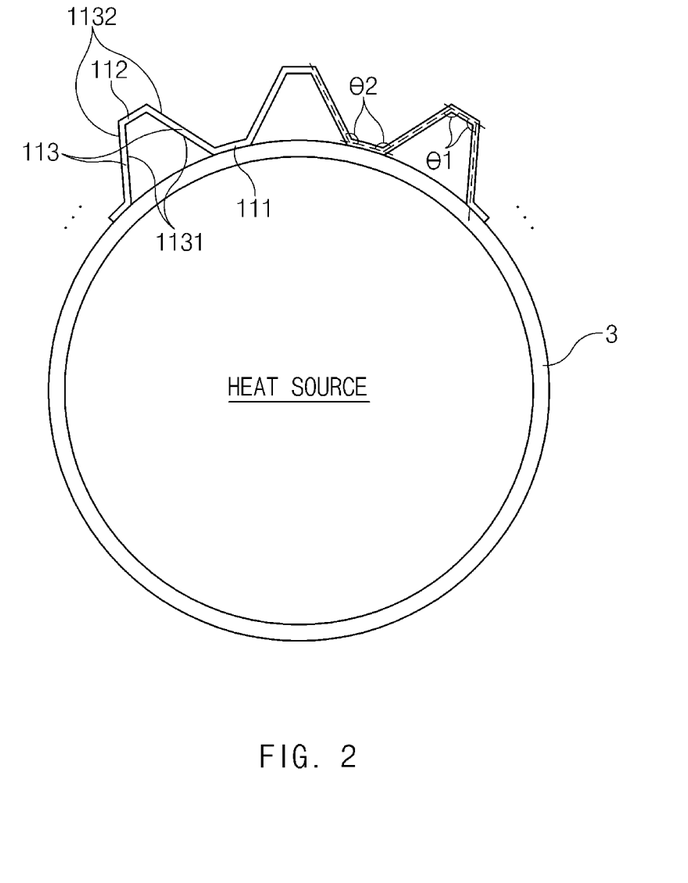
FIG. 2 is a view illustrating a frame of FIG. 1.

FIG. 2 is a view illustrating the frame 110 of FIG. 1.

The frame 110 may be designed to effectively transfer heat from the heat source to the thermoelectric elements 120. The frame 110 may be formed of a material with high electrical insulation resistance to improve the performance of the thermoelectric module.

For example, the frame 110 may be formed of a heat-resistance polymer such as polyimide.

The angles between each of the cool-side end portions 112 and two thermoelectric element installation portions 113 connected thereto, among the plurality of thermoelectric element installation portions 113, may be greater than 90 degrees such that the cool-side end portion 112 and the two thermoelectric element installation portions 113 connected thereto form a trapezoidal shape with the cool-side end portion 112 as the upper base and the two thermoelectric element installation portions 113 as the lateral sides.

Referring to FIG. 2, the frame 110 may be mounted on the exhaust tube 3 such that each cool-side end portion 112 and the thermoelectric element installation portions 113 connected thereto have an angle of θ1 greater than 90 degrees therebetween. Furthermore, the frame 110 may be mounted on the exhaust tube 3 such that each hot-side end portion 111 and the thermoelectric element installation portions 113 connected thereto have an angle of θ2 greater than 90 degrees therebetween.

That is, the cool-side end portion 112, the two thermoelectric element installation portions 113 connected thereto, and the exhaust tube 3 may form a trapezoidal shape with the cool-side end portion 112 as the upper base, part of the outer circumferential surface of the exhaust tube 3 as the lower base, and the two thermoelectric element installation portions 113 as the lateral sides.

In other words, the frame 110 may be mounted on the exhaust tube 3 to form a shape similar to gear teeth.

In some forms of the present disclosure, the frame 110 may be mounted on the exhaust tube 3 to completely circumferentially surround the exhaust tube 3. In this case, the exhaust tube 3 and the frame 110 may form a cross-section having a gear shape as a whole.

The above-configured frame 110 may distribute shocks that are applied to the thermoelectric module when the exhaust tube 3 vibrates, thereby improving structural stability of the thermoelectric module.

Each of the cool-side end portions 112 and the thermoelectric element installation portions 113 connected thereto may form a buffer space together with the exhaust tube 3. That is, the buffer space may be a space surrounded by the cool-side end portion 112, the two thermoelectric element installation portions 113 connected thereto, and part of the outer circumferential surface of the exhaust tube 3. As illustrated in FIG. 2, the buffer space may have a substantially trapezoidal cross-section.

Figure 3:
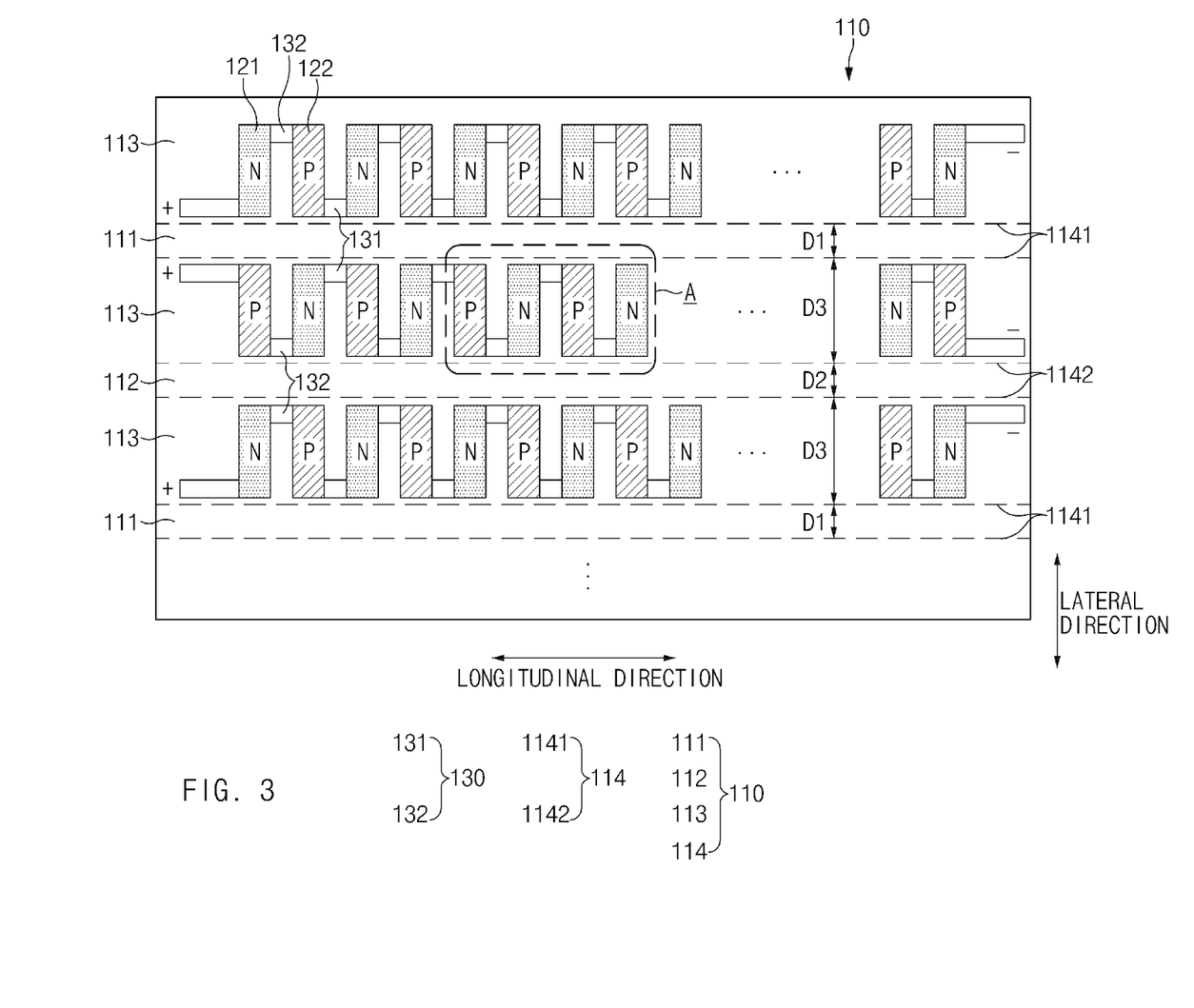
FIG. 3 is a view illustrating the frame in an unbent state.

FIG. 3 is a top view illustrating the frame 110 in an unbent state.

Referring to FIG. 3, the frame 110 may have a rectangular plate shape that extends in the longitudinal direction and the lateral direction.

The frame 110 may include guide grooves 114 for guiding locations where the frame 110 is bent. The guide grooves 114 may be formed between the plurality of hot-side end portions 11 and the plurality of thermoelectric element installation portions 113 and between the plurality of cool-side end portions 112 and the plurality of thermoelectric element installation portions 113.

Each of the guide grooves 114 may be formed on the top side or the bottom side of the frame 110 to face the direction in which the frame 110 is bent.

The frame 110 may include the plurality of the guide grooves 114 that extend in the longitudinal direction of the frame 110 and are arranged parallel to each other in the lateral direction of the frame 110, thereby allowing the frame 110 to be alternately bent upward and downward. The plurality of guide grooves 114 may be alternately formed in pairs on the top side and the bottom side of the frame 110.

The plurality of guide grooves 114 may include a plurality of pairs of outer guide grooves 1141 formed on the top side of the frame 110 and a plurality of pairs of inner guide grooves 1142 formed on the bottom side of the frame 110.

Each pair of outer guide grooves 1141 may be spaced apart from each other by a first distance D1 to form each hot-side end portion 111.

Each pair of inner guide grooves 1142 may be spaced apart from each other by a second distance D2 to form each cool-side end portion 112.

The pair of outer guide grooves 1141 may be spaced apart from the pair of inner guide grooves 1142 by a third distance D3 to form each thermoelectric element installation portion 113.

The frame 110 may have a property of being maintained in a bent state.

The locations where the frame 110 is bent, as well as the directions in which the frame 110 is bent, may be guided by the guide grooves 114. Accordingly, the frame 110 may be alternately bent upward and downward by applying a force to the frame 110 when mounting the frame 110 and may thus be easy to mount on the exhaust tube 3.

Referring to FIG. 3, the plurality of n-type and p-type thermoelectric elements 121 and 122 may be alternately arranged on the thermoelectric element installation portions 113 in the longitudinal direction of the frame 110.

The thermoelectric module may include a plurality of hot-side electrodes 131 and cool-side electrodes 132 for electrically connecting, in series, the plurality of n-type and p-type thermoelectric elements 121 and 122 arranged on each of thermoelectric element installation portions 113.

The plurality of n-type and p-type thermoelectric elements 121 and 122 may be electrically connected in series by the hot-side electrodes 131 and the cool-side electrodes 132.

The plurality of n-type thermoelectric elements 121 may include one end portion adjacent to the hot-side end portion 111 and an opposite end portion adjacent to the cool-side end portion 112.

The plurality of p-type thermoelectric elements 122 may include one end portion adjacent to the hot-side end portion 111 and an opposite end portion adjacent to the cool-side end portion 112.

Each of the hot-side electrodes 131 may connect the n-type thermoelectric element 121 and the p-type thermoelectric element 122 adjacent to each other. The hot-side electrode 131 may connect the one end portion of the n-type thermoelectric element 121 adjacent to the hot-side end portion 111 and the one end portion of the p-type thermoelectric element 122 adjacent to the hot-side end portion 111. That is, each of the hot-side electrodes 131 may connect the adjacent n-type and p-type thermoelectric elements 121 and 122 at the hot side.

Each of the cool-side electrodes 132 may connect the n-type thermoelectric element 121 and the p-type thermoelectric element 122 adjacent to each other. The cool-side electrode 132 may connect the opposite end portion of the n-type thermoelectric element 121 adjacent to the cool-side end portion 112 and the opposite end portion of the p-type thermoelectric element 122 adjacent to the cool-side end portion 112. Each of the cool-side electrodes 132 may connect, at the cool side, the adjacent n-type and p-type thermoelectric elements 121 and 122 that are not connected by the hot-side electrode 131.

The plurality of n-type and p-type thermoelectric elements 121 and 122 arranged on each thermoelectric element installation portion 113 may be electrically connected in series by the electrodes 130.

Referring to FIG. 3, among the plurality of thermoelectric elements 120 arranged on each thermoelectric element installation portion 113, the thermoelectric elements 120 located on opposite longitudinal ends of the frame 110 may be connected to positive (+) and negative (−) electrodes of an object to which electric power is to be supplied. Here, the object to which electric power is to be supplied may be an electronic unit of the vehicle that receives electric power from the thermoelectric module or an energy storage device that stores electric power generated by the thermoelectric module.

For example, among the plurality of thermoelectric elements 120 arranged on any one of the thermoelectric element installation portions 113, the thermoelectric element 120 located on one longitudinal end of the frame 110 may be connected to a positive (+) electrode, and the thermoelectric element 120 located on an opposite longitudinal end of the frame 110 may be connected to a negative (−) electrode.

In some forms of the present disclosure, although not illustrated, the plurality of thermoelectric elements 120 arranged on the thermoelectric element installation portions 113 may be electrically connected together at a distal end of the frame 110 in the longitudinal direction. The electrodes 30 may further include a connecting electrode for electrically connecting the plurality of thermoelectric elements 120 arranged on the thermoelectric element installation portions 113 adjacent to each other, and all or some of the thermoelectric element installation portions 113 arranged on the frame 110 may be electrically connected in series by the connecting electrode. In this case, among the plurality of thermoelectric elements 120, the thermoelectric element 120 located on one longitudinal end and one lateral end of the frame 110 may be connected to the positive (+) electrode of an object to which electric power is to be supplied, and the thermoelectric element 120 located on an opposite longitudinal end and an opposite lateral end of the frame 110 may be connected to the negative (−) electrode of the object to which electric power is to be supplied.

Figure 4:
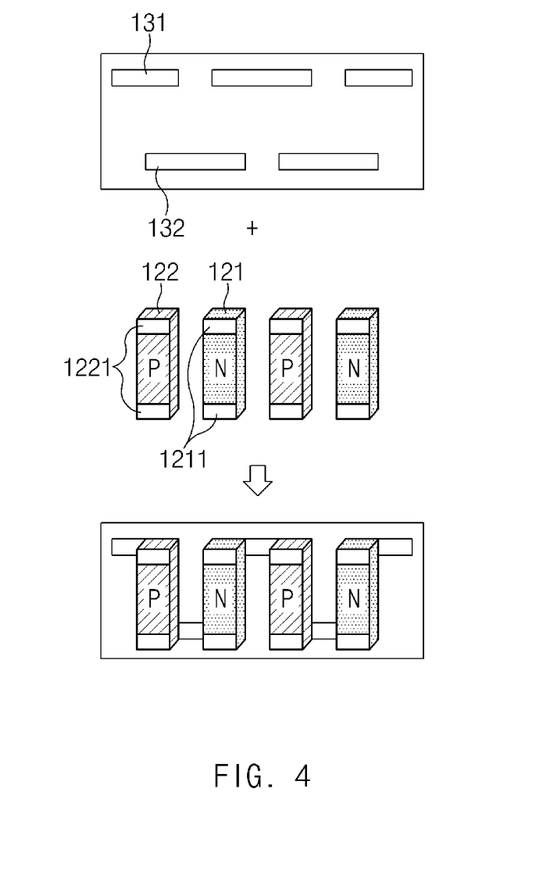
FIG. 4 is a view illustrating portion A of FIG. 3.

FIG. 4 is a view illustrating portion A of FIG. 3.

Referring to FIG. 4, the electrodes 130 may be printed on the thermoelectric element installation portions 113. The hot-side electrodes 131 and the cool-side electrodes 132 for electrically connecting the thermoelectric elements 120 in series may be provided on the thermoelectric element installation portions 113 in the state in which the thermoelectric elements 120 are disposed on the thermoelectric element installation portions 113.

Each of the n-type thermoelectric elements 121 may have, on opposite ends thereof, metal coatings 1211 that are metal coating layers. Each of the p-type thermoelectric elements 122 may have, on opposite ends thereof, metal coatings 1221 that metal coating layers.

The plurality of n-type and p-type thermoelectric elements 121 and 122 may be installed in the positions corresponding to the electrodes 130 on the thermoelectric element installation portions 130 such that the metal coatings 1211 and 1221 are brought into contact with the hot-side electrodes 131 and the cool-side electrodes 132.

As described above, the thermoelectric elements 120 may be installed, with the electrodes 130 printed in advance on the frame 110, and thus the thermoelectric module may be efficiently manufactured in an easy and simple manner.

In addition, the metal coatings 1211 and 1221 on the opposite ends of the thermoelectric elements 120 may result in an improvement in the electrical connection between the thermoelectric elements 120 and the electrodes 130.

Figure 5:
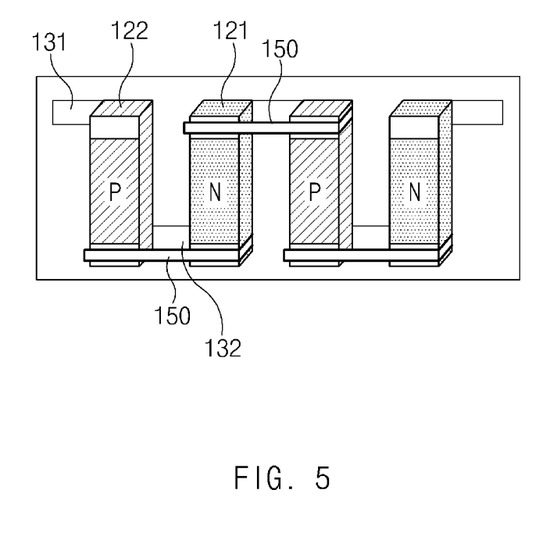
FIG. 5 is a view illustrating a state in which clamping members are installed in portion A of FIG. 3.

FIG. 5 is a view illustrating a state in which clamping members 150 are installed in portion A of FIG. 3.

In some forms of the present disclosure, the thermoelectric module may further include the clamping members 150 for firmly securing the thermoelectric elements 120 to the frame 110.

Each of the clamping members 150 may encircle end portions of the n-type thermoelectric element 121 and the p-type thermoelectric element 122 adjacent to each other and may be connected to the thermoelectric element installation portion 113.

The clamping members 150 enable more stable electrical connection between the thermoelectric elements 120 and the electrodes 130 and may result in an improvement in the coupling force between thermoelectric elements 120 and the thermoelectric element installation portions 113.

Figure 6:
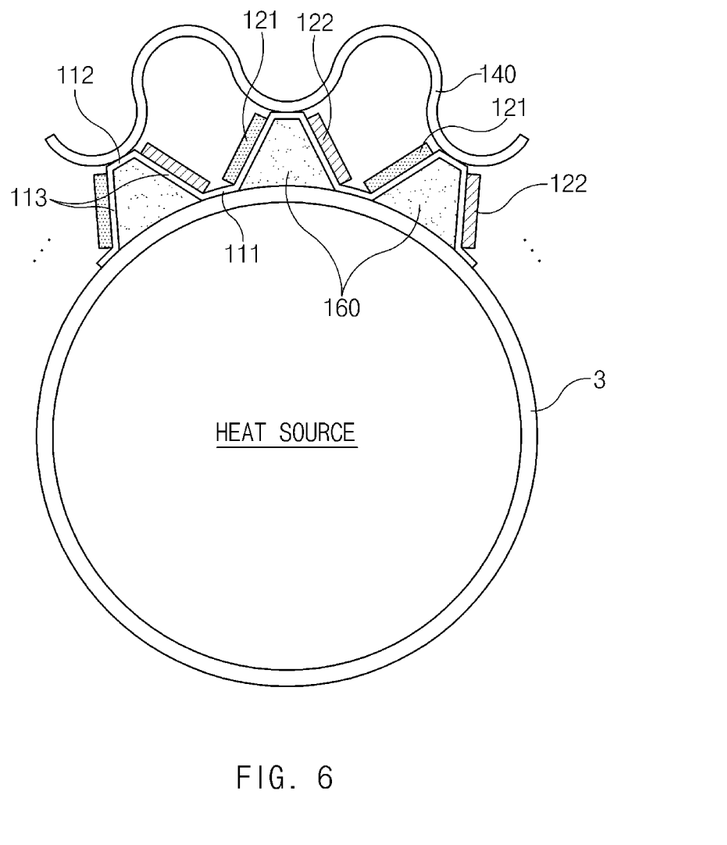
FIG. 6 is a view illustrating a state in which buffer members are installed in the thermoelectric module in one form of the present disclosure.

FIG. 6 is a view illustrating a state in which buffer members 160 are installed in the thermoelectric module in some forms of the present disclosure.

In some forms of the present disclosure, the thermoelectric module may further include the buffer members 160.

The buffer members 160 may be disposed in the buffer spaces defined by the plurality of cool-side end portions 112, the plurality of thermoelectric element installation portions 113, and the exhaust tube 3 and may reduce vibrations between the exhaust tube 3 and the frame 110.

For example, the exhaust tube 3 may vibrate due to an influence of the engine while the vehicle is being driven. In this case, the buffer members 160 may reduce vibration transmission from the exhaust tube 3 to the thermoelectric elements 120 through the frame 110, thereby preventing deterioration in the performance of the thermoelectric module due to deformation or separation of the components of the thermoelectric module.

The buffer members 160 may improve the coupling force between the thermoelectric module and the exhaust tube 3. The buffer members 160 may be bonded to both the frame 110 and the outer circumferential surface of the exhaust tube 3 to increase the bonding area between the thermoelectric module and the exhaust tube 3.

The buffer members 160 may have a shape corresponding to the shape of the buffer spaces, thereby further improving the buffering effect and the coupling force.

The buffer members 160 may preferably have high heat resistance to effectively transfer heat from the exhaust tube 3 to the thermoelectric elements 120. The aim is to minimize heat transfer from the heat source to the buffer members 160, thereby transferring a larger amount of heat from the heat source to the thermoelectric elements 120.

For example, the buffer members 160 may be formed of a porous material such as Styrofoam.

The above-configured thermoelectric module is applicable to various forms of pipe heat sources and has a structure that is capable of effectively using thermal energy supplied from the pipe heat sources.

Even though the thermoelectric module is mounted on the exhaust tube 3 of the vehicle and exposed to external shocks such as vibrations, the thermoelectric module with a structure robust to the external shocks may be prevented from being damaged and may maintain the performance thereof. Specifically, the angles of the bent portions of the frame 110 may be greater than 90 degrees, whereby the external shocks applied to the frame 110 may be effectively distributed. Furthermore, the external shocks applied to the frame 110 and the thermoelectric elements 120 may also be alleviated by the buffer members 160.

In addition, the frame 110 for the thermoelectric module according to the present disclosure may have the guide grooves 114 appropriate for manufacturing the thermoelectric module according to the present disclosure. The guide grooves 114 may guide the directions in which the frame 110 is bent and the locations where the frame 110 is bent, thereby facilitating the installation and manufacturing of the thermoelectric module.

In some forms of the present disclosure, at least the following effects are achieved.

First, the thermoelectric module includes the frame alternately bent toward the hot side on which the heat source is located and the cool side on which the cooling medium is located, to have the hot-side end portions, the cool-side end portions, and the thermoelectric element installation portions, whereby the thermoelectric module is applicable to various forms of heat sources to effectively receive thermal energy from the heat sources.

Second, the frame is bent to form the hot-side end portions, the cool-side end portions, and the thermoelectric element installation portions, whereby when external shocks are applied to the thermoelectric module, the integrated frame can distribute the external shocks, thereby improving structural stability of the thermoelectric module.

Third, since the thermoelectric module according to the present disclosure has less limitation due to an installation environment, it is easy to increase the size of the thermoelectric module, and it is possible to maximize thermoelectric power generation by optimizing the application area of the thermoelectric module according to heat sources.

Fourth, the thermoelectric module according to the present disclosure has a simpler configuration than thermoelectric modules in the related art, thereby achieving a reduction in weight and volume.

Fifth, in the case where the cool side of the thermoelectric module is cooled by external air, separate power for operating the thermoelectric module does not have to be supplied, and thus the thermoelectric module can be operated without power consumption.

Effects of the present disclosure are not limited to the aforementioned effects, and any other effects not mentioned herein will be clearly understood from the accompanying claims by those skilled in the art to which the present disclosure pertains.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:
1. A thermoelectric module comprising:
 a frame alternately bent toward a hot side on which a heat source is located and a cool side on which a cooling medium is located, the frame further comprising:
 a plurality of hot-side end portions in contact with the heat source;
 a plurality of cool-side end portions in contact with the cooling medium; and
 a plurality of thermoelectric element installation portions configured to connect with the plurality of hot-side end portions and the plurality of cool-side end portions;
 a plurality of n-type thermoelectric elements arranged on the thermoelectric element installation portions;
 a plurality of p-type thermoelectric elements arranged on the thermoelectric element installation portions;
 a plurality of first electrodes and a plurality of second electrodes configured to electrically connect, in series, the plurality of n-type thermoelectric elements and the plurality of p-type thermoelectric elements; and buffer members disposed in buffer spaces defined by the plurality of cool-side end portions, the plurality of thermoelectric element installation portions, and the heat source, wherein each of the buffer members is configured to be bonded to both the frame and an outer surface of the heat source.

2. The thermoelectric module of claim 1, wherein the plurality of hot-side end portions is configured to:
have a hot-side contact surface in contact with the heat source having a pipe shape; and
be arranged in a circumferential direction of the heat source,
wherein the plurality of cool-side end portions is configured to:
have a cool-side contact surface in contact with the cooling medium; and
be arranged in the circumferential direction of the heat source.

3. The thermoelectric module of claim 2, wherein the frame further comprises:
a plurality of guide grooves configured to:
guide locations where the frame is bent;
form on portions where the plurality of hot-side end portions and the plurality of thermoelectric element installation portions are connected; and
form on portions where the plurality of cool-side end portions and the plurality of thermoelectric element installation portions are connected.

4. The thermoelectric module of claim 3, wherein each guide groove of the plurality of guide grooves is configured to:
form on a top side or a bottom side of the frame; and
face a direction in which the frame is bent.

5. The thermoelectric module of claim 2, wherein the plurality of n-type thermoelectric elements and the plurality of p-type thermoelectric elements are alternately arranged on the thermoelectric element installation portion in a longitudinal direction that is perpendicular to the circumferential direction, wherein the pipe-shaped heat source extends in the longitudinal direction.

6. The thermoelectric module of claim 5, wherein the first electrodes and the second electrodes are printed on the thermoelectric element installation portion.

7. The thermoelectric module of claim 6, wherein:
each n-type thermoelectric element of the plurality of n-type thermoelectric elements has metal coatings on opposite ends of the each n-type thermoelectric element of the plurality of n-type thermoelectric elements and is disposed on the thermoelectric element installation portion such that the metal coatings make contact with the first electrodes and the second electrodes; and
each p-type thermoelectric element of the plurality of p-type thermoelectric elements has metal coatings on opposite ends of the each p-type thermoelectric element of the plurality of p-type thermoelectric elements and is disposed on the thermoelectric element installation portion such that the metal coatings make contact with the first electrodes and the second electrodes.

8. The thermoelectric module of claim 2, wherein:
angles between each cool-side end portion of the plurality of cool-side end portions and two thermoelectric element installation portions of the plurality of thermoelectric element installation portions are greater than 90 degrees, and
the cool-side end portion of the plurality of cool-side end portions and the two thermoelectric element installation portions of the plurality of thermoelectric element installation portions form a trapezoidal shape with the cool-side end portion of the plurality of cool-side end portions as an upper base of the trapezoidal shape and the two thermoelectric element installation portions of the plurality of thermoelectric element installation portions as lateral sides of the trapezoidal shape.

9. The thermoelectric module of claim 8, wherein the plurality of n-type thermoelectric elements and the plurality of p-type thermoelectric elements are arranged on an outer surface of each thermoelectric element installation portion of the plurality of thermoelectric element installation portions that faces the cooling medium.

10. The thermoelectric module of claim 1, wherein the frame is formed of a heat-resistant polymer.

11. The thermoelectric module of claim 1, wherein the cooling medium is an air-cooled cooling member that is disposed to exchange heat with the plurality of cool-side end portions and that is cooled by external air.

12. The thermoelectric module of claim 1, wherein:
the cooling medium is a water-cooled cooling member through which cooling water flows, wherein the water-cooled cooling member is disposed to exchange heat with the plurality of cool-side end portions.

13. The thermoelectric module of claim 1, wherein:
the frame surrounds the heat source having a pipe shape in a circumferential direction outside the heat source, and
the cooling medium is a cooling member configured to surround the frame in the circumferential direction outside the frame.

14. A vehicle comprising:
an exhaust tube through which high-temperature fluid flows; and
a thermoelectric module installed on the exhaust tube to generate power using heat of fluid flowing through the exhaust tube,
wherein the thermoelectric module comprises:
a frame alternately bent toward a hot side on which the exhaust tube is located and a cool side on which a cooling medium is located, wherein the frame further comprises:
a plurality of hot-side end portions in contact with the exhaust tube; and
a plurality of cool-side end portions in contact with the cooling medium;
a plurality of thermoelectric element installation portions connecting the plurality of hot-side end portions and the plurality of cool-side end portions;
a plurality of n-type thermoelectric elements arranged on the thermoelectric element installation portions;
a plurality of p-type thermoelectric elements arranged on the thermoelectric element installation portions;
a plurality of first electrodes and a plurality of second electrodes configured to electrically connect, in series, the plurality of n-type thermoelectric elements and the plurality of p-type thermoelectric elements; and
buffer members disposed in buffer spaces defined by the plurality of cool-side end portions, the plurality of thermoelectric element installation portions, and the exhaust tube, and
wherein each of the buffer members is bonded to both the frame and an outer surface of the exhaust tube.

* * * * *